United States Patent
Kaneko et al.

[11] Patent Number: 5,942,808
[45] Date of Patent: Aug. 24, 1999

[54] SEMICONDUCTOR DEVICE WITH PLURAL POWER SUPPLY CIRCUITS, PLURAL INTERNAL CIRCUITS, AND SINGLE EXTERNAL TERMINAL

[75] Inventors: Masaki Kaneko; Hiroyuki Kobatake; Masakazu Amanai; Kazuaki Kato; Satoru Oku, all of Tokyo, Japan

[73] Assignee: NEC Corporation, Tokyo, Japan

[21] Appl. No.: 09/140,651

[22] Filed: Aug. 26, 1998

[30] Foreign Application Priority Data

Aug. 28, 1997 [JP] Japan ................................ 9-232675

[51] Int. Cl.$^6$ ........................................ H02J 1/10
[52] U.S. Cl. .................. 307/18; 307/28; 307/29
[58] Field of Search .................. 307/18, 23, 28, 307/29, 31, 112, 116, 125, 130, 131; 327/530, 540–543

[56] References Cited

U.S. PATENT DOCUMENTS

| | | | |
|---|---|---|---|
| 5,349,559 | 9/1994 | Park et al. ........................ | 307/296.6 |
| 5,396,113 | 3/1995 | Park et al. ........................ | 327/543 |
| 5,557,232 | 9/1996 | Shimogawa ...................... | 327/545 |
| 5,638,013 | 6/1997 | Iwata et al. ...................... | 327/126 |
| 5,818,783 | 10/1998 | Kim ................................. | 365/226 |

*Primary Examiner*—Jeffrey Gaffin
*Assistant Examiner*—Peter Zura
*Attorney, Agent, or Firm*—Sughrue, Mion, Zinn, Macpeak & Seas, PLLC

[57] ABSTRACT

A semiconductor device has a plurality of power supply circuits whose generated voltages are different from each other, and a plurality of internal circuits whose operating voltages are different from each other. The power supply circuits and the internal circuits are interconnected by power lines with respective power supply switches inserted therein. The power lines are connected to a single external terminal by respective control lines with respective external switches inserted therein. The power supply circuits and the internal circuits can be tested from the single external terminal.

12 Claims, 7 Drawing Sheets

SEMICONDUCTOR DEVICE WITH PLURAL POWER SUPPLY CIRCUITS, PLURAL INTERNAL CIRCUITS, AND SINGLE EXTERNAL TERMINAL

BACKGROUND OF THE INVENTION

1. Field of the Invention

The present invention relates to a semiconductor device having a plurality of power supply circuits and a plurality of internal circuits, and more particularly to a method of testing a semiconductor device having a plurality of power supply circuits whose generated voltages are different from each other, and a plurality of internal circuits whose operating voltages are different from each other.

2. Description of the Related Art

Various semiconductor devices have found use in various fields. One example of conventional semiconductor device is a flash memory as an information storage medium.

Flash memories are capable of electrically writing and reading information. However, different voltages are required to write and read information.

Specifically, information stored in a flash memory is read under an ordinary power supply voltage. However, voltages different from the ordinary power supply voltage are needed respectively to write and erase information. For this reason, a flash memory has a plurality of power supply circuits whose generated voltages are different from each other, and a plurality of internal circuits whose operating voltages are different from each other.

One such conventional semiconductor device will be described below with reference to FIGS. 1 through 3 of the accompanying drawings.

As shown in FIG. 1, a semiconductor device 1 has a charge pump 2 as a high-voltage power supply circuit for outputting high-voltage positive electric power and a charge pump 3 as a low-voltage power supply circuit for outputting low-voltage positive electric power.

To the charge pump 2, there is connected a high-voltage internal circuit 4 which operates with high-voltage electric power. To the charge pump 3, there is connected a low-voltage internal circuit 5 which operates with low-voltage electric power.

The charge pump 2 and the internal circuit 4 are interconnected by a high-voltage power line 6a having a high-voltage power supply switch unit 8. The charge pump 3 and the internal circuit 5 are interconnected by a low-voltage power line 7a having a low-voltage power supply switch unit 9.

The power supply switch units 8, 9 have respective pairs of p-type MOS (Metal Oxide Semiconductor) transistors 10, 11 inserted in series in the respective power lines 6a, 7a. In the MOS transistors 10, 11, back gates 12 are connected in opposite directions.

Level shifters 14, 15 are connected respectively to gate electrodes 13 of the MOS transistors 10, 11 of the power supply switch units 8, 9. The level shifters 14, 15 are connected to control terminals 16, 17 of the power supply switch units 8, 9.

Each of the level shifters 14, 15 comprises a pair of p-type MOS transistors 18, 19 and a pair of n-type MOS transistors 20, 21. The MOS transistors 20, 21 of the level shifters 14, 15 are connected to the control terminals 16, 17 through inverters 22.

High- and low-voltage control lines 6b, 7b are connected respectively to junctions between the charge pumps 2, 3 and the internal circuits 4, 5. High- and low-voltage connection pads 31, 32 serving as external terminals are connected respectively to the control lines 6b, 7b.

A high-voltage external switch unit 33 is connected to the high-voltage control line 6b, and a low-voltage external switch unit 34 is connected to the low-voltage control line 7b.

The external switch units 33, 34 are identical in structure to each other, and have p-type MOS transistors 35, respectively, which serve as high- and low-voltage external switches. The MOS transistors 35 have respective back gates 12 connected to the control line 6b which in turn is connected to the power line 6a connected to the charge pump 2. The MOS transistors 35 have respective gate electrodes 13 connected to respective level shifters 36, 37.

Each of the level shifters 36, 37 comprises a pair of p-type MOS transistors 18, 19 and a pair of n-type MOS transistors 20, 21. The MOS transistors 20, 21 of the level shifters 36, 37 are connected to respective control terminals 38, 39 through inverters 22.

A control circuit (not shown) is connected to the control terminals 16, 17, 38, 39 of the switch units 8, 9, 33, 34.

The control circuit outputs a control signal "SW1" for turning on and off the power supply switch unit 8 to the control terminal 16, and outputs a control signal "SW2" for turning on and off the external switch unit 33 to the control terminal 38.

Similarly, the control circuit outputs a control signal "SW3" for turning on and off the power supply switch unit 9 to the control terminal 17, and outputs a control signal "SW4" for turning on and off the external switch unit 34 to the control terminal 39.

The control circuit has a dedicated input terminal for receiving control information from an external source for turning on and off the switch units 8, 9, 33, 34 under integrated control.

As shown in FIG. 2 of the accompanying drawings, when the semiconductor device 1 is in a normal mode of operation, the power supply switch units 8, 9 are turned on by the control circuit, and the high- and low-voltage external switch units 33, 34 are turned off by the control circuit.

At this time, electric power of different voltages are supplied from the charge pumps 2, 3 through the power supply switch units 8, 9 to the internal circuits 4, 5. Therefore, the internal circuits 4, 5 whose operating voltages are different from each other can operate normally.

The charge pumps 2, 3 and the internal circuits 4, 5 are disconnected from the connection pads 31, 32 by the switch units 33, 34. Therefore, the electric power generated by the charge pumps 2, 3 is prevented from leaking out from the connection pads 31, 32. At the same time, noise is prevented from entering the internal circuits 4, 5 from the connection pads 31, 32.

For conducting various tests on the semiconductor device 1, a testing external circuit (not shown) is connected to the connection pads 31, 32 and the input terminal of the control circuit, and the control circuit turns on and off the switch units 8, 9, 33, 34. For example, for detecting the electric power supplied from the charge pumps 2, 3 to the internal circuits 4, 5, all the switch units 8, 9, 33, 34 are turned on, as shown in FIG. 3a of the accompanying drawings.

The voltage of the electric power supplied from the high-voltage charge pump 2 to the internal circuit 4 can now be detected from the high-voltage connection pad 31, and the voltage of the electric power supplied from the low-voltage charge pump 3 to the internal circuit 5 can now be detected from the low-voltage connection pad 32.

For supplying electric power from an external power source connected to the high-voltage connection pad 31 to the internal circuits 4, 5, the power supply switch units 8, 9 are turned off and the external switch units 33, 34 are turned on.

Electric power can now be supplied from the high-voltage connection pad 31 to the internal circuit 4, and electric power can now be supplied from the low-voltage connection pad 32 to the internal circuit 5.

In the above semiconductor device 1, the charge pumps 2, 3 and the internal circuits 4, 5 correspond to positive voltages. Therefore, the various components connected to the power lines 6a, 7a and the control lines 6b, 7b are turned on and off by the p-type MOS transistors 10, 11, 35.

In the p-type MOS transistors 10, the direction of the electric power that can be turned on and off is limited because of the direction in which the back gates 12 are connected.

For example, in the external switch units 33, 34, the potentials at the junctions between the charge pumps 2, 3 and the internal circuits 4, 5 are higher than the potentials at the connection pads 31, 32 in the normal mode of operation, and the potentials at the connection pads 31, 32 are never higher.

For disconnecting the higher-potential circuits 2–5 from the lower-potential connection pads 31, 32 in the normal mode of operation, the back gates 12 of the MOS transistors 35 of the external switch units 33, 34 are connected to the lines 6b, 7b that are connected to the circuits 2–5.

If the voltages of electric power to be supplied from the connection pads 31, 32 to the internal circuits 4, 5 are higher than the voltages of electric power produced by the charge pumps 2, 3, then the electric power supplied from the external power source can well be supplied from the connection pads 31, 32 to the internal circuits 4, 5.

At this time, the MOS transistors 35 whose back gates 12 are connected to the lines 6b, 7b that are connected to the circuits 2–5 cannot turn on and off the electric power supplied from the external power source. However, no problem arises because the electric power supplied from the external power source can be turned on and off by the external power source which is connected to the connection pads 31, 32.

With respect to the power supply switches 8, 9, since higher potentials switch around in the normal and test modes of operation, it is necessary to turn on and off the supplied electric power no matter which side of the power supply switches 8, 9 the higher potentials are present on.

To meet such a requirement, the MOS transistors 10, 11 whose back gates 12 are connected in different directions are inserted in series in the power lines 6a, 7a.

In the above semiconductor device 1, the charge pumps 2, 3, the internal circuits 4, 5, and the connection pads 31, 32 can be connected in various configurations by the switch units 8, 9, 33, 34. Therefore, the semiconductor device 1 can be subject to various test modes of operation as well as the normal mode of operation.

For individually testing the two charge pumps 2, 3 and the two internal circuits 4, 5, the semiconductor device 1 has the two connection pads 31, 32. The connection pads 31, 32 are provided as terminals projecting outwardly from the semiconductor device 1. If the number of connection pads increases, then the semiconductor device 1 has an increased outer profile and needs an increased installation area.

Since the above semiconductor device 1 has the two charge pumps 2, 3 and the two internal circuits 4, 5, there are also two connection pads 31, 32. However, if the number of voltage types increases, then the number of connection pads that are required also increases, resulting in an increased semiconductor device size.

SUMMARY OF THE INVENTION

It is therefore an object of the present invention to provide a semiconductor device having a plurality of power supply circuits, a plurality of internal circuits, and a single testing external terminal.

In a semiconductor device according to the present invention, a plurality of power supply switches are inserted respectively in power lines connecting power supply circuits and internal circuits. The power lines are connected to a single external terminal by respective control lines with respective external switches inserted therein.

When the semiconductor device is in a normal mode of operation, the power supply switches connect the power supply circuits respectively to the internal circuits, which can operate normally with electric power supplied from the power supply circuits.

In testing electric power supplied from the power supply switches to the corresponding one of the internal circuits from the external terminal, the power supply switch and the external switchs which connect the power supply switchs and the internal circuits to the external terminal are turned on. Therefore, the electric power supplied from the power supply circuits to the corresponding internal circuits can be detected from the single external terminal.

In a test for supplying electric power from an external power source through the external terminal to the internal circuits, the external switches connecting the internal circuit to the external terminal are turned on, and the power supply switches which connect the internal circuit to corresponding power supply circuits are turned off. Thus, the electric power from the external power source can be supplied to the internal circuits without being affected by electric power generated by the power supply circuits.

Since the power supply circuits and the internal circuits can individually be tested with a single external terminal, the semiconductor device has a relatively small outer profile and needs a relatively small installation area.

In the above semiconductor device, at least one of the external switches may comprise a low-voltage external switch inserted in at least one of the control lines connected to at least one of the power lines for transmitting electric power having a voltage which is not the highest of the voltages, the low-voltage external switch comprising a MOS transistor having a back gate. The semiconductor device may further comprise at least one high-voltage control switch for selectively connecting the back gate of the MOS transistor to the control line connecting the power supply switch for turning on and off the electric power having the highest voltage and the internal circuit for operation with the electric power having the highest voltage, and at least one low-voltage control switch for selectively connecting the back gate of the MOS transistor to the control line connecting the power supply switch for turning on and off the electric power having a lower voltage and the internal circuit for operation with the electric power having a lower voltage.

Since the external switch may comprise a MOS transistor, the integration density of the semiconductor device may be increased. The power line for transmitting the electric power having the highest voltage is connected to the back gate of the MOS transistor of the external switch inserted in the power line which does not transmit the electric power having the highest voltage. Thus, the external switch comprising the MOS transistor can selectively be turned on and off.

A high voltage referred to in the description of the present invention means the highest voltage occurring in the semiconductor device, and a low voltage means a voltage which is not the highest voltage. For example, if a voltage supplied from an external power source to the semiconductor device is 3 V and the power supply circuits generate output voltages of 6 V and 12 V, respectively, then the voltage of 12 V is referred to as a high voltage and the voltage of 6 V as a low voltage.

That at least one low-voltage external switch comprises a MOS transistor means that there is at least one low-voltage external switch and each such low-voltage external switch comprises a MOS transistor.

In the above semiconductor device, the high-voltage control switch may comprise a MOS transistor having a back gate connected to the control line connecting the power supply switch for turning on and off the electric power having the highest voltage and the internal circuit for operation with the electric power having the highest voltage, and the low-voltage control switch may comprise a MOS transistor having a back gate connected to the back gate of the MOS transistor of the low-voltage external switch.

Since each of the control switches may comprise a MOS transistor, the integration density of the semiconductor device may be increased. The back gate of the MOS transistor of the high-voltage control switch is connected to the power line for transmitting the electric power having the highest voltage, and the back gate of the MOS transistor of the low-voltage control switch is connected to the back gate of the MOS transistor of the low-voltage external switch. Therefore, the high- and low-voltage control switches can well control the external switch.

In the above semiconductor device, each of the power supply circuits may generate electric power having a positive voltage, and each of the MOS transistors may comprise a p-type MOS transistor. The positive-voltage electric power may reliably be turned on and off by the p-type MOS transistors of the power supply switches and the external switches.

In the above semiconductor device, alternatively, each of the power supply circuits may generate electric power having a negative voltage, and each of the MOS transistors may comprise an n-type MOS transistor. The negative-voltage electric power may reliably be turned on and off by the n-type MOS transistors of the power supply switches and the external switches.

According to one method of testing the semiconductor device, when the electric power supplied from one of the plurality of power supply circuits to an internal circuit is detected the power supply switch and the external switch which connect the power supply circuit and the external terminal are both turned on and all the external circuits which connect the other power supply switches and the external terminal are turned off when electric power is supplied from an external power source to an internal circuit the external switch connecting the internal circuit and the external terminal is turned on and the power supply switch connecting the internal circuit and the power supply circuit, and all the other external switches connecting the other internal circuits and the external terminal are turned off.

Even though the semiconductor device has a single external terminal, a test may be conducted to detect electric power supplied from a single power supply switch to a single internal circuit from one external terminal, and a test may be conducted to electric power supply from the one external terminal to the internal circuits.

According to another method of testing the semiconductor device, when electric power supplied from a high-voltage power supply circuit to a high-voltage external switch is detected, both the high-voltage power supply switch and the high-voltage external switch are turned on, and each of the low-voltage external switches are turned off. When the electric power supplied from a single low-voltage power supply circuit to a low-voltage internal circuit is detected, both the low-voltage power supply switch and the low-voltage external switch connected to the low-voltage power supply circuit, and the high-voltage power supply switch are turned on and the other low-voltage power supply circuits and all the high-voltage external switches are turned off. When a voltage is applied from an external power source to a high-voltage internal circuit the high-voltage external switch is turned on and the high-voltage power supply switch and all the low-voltage external switches are turned off. When a voltage is applied from an external power source to a single low-voltage internal circuit. the low-voltage external switch connecting the low-voltage internal circuit and the external terminal and the high-voltage power supply switch are turned on and the low-voltage power supply switch connecting the low-voltage internal circuit and the low-voltage power supply circuit, and all low-voltage power supply circuit are turned off.

Consequently, even though the semiconductor device has a single external terminal, a test may be conducted to detect electric power supplied from one power supply switch to an internal circuit from the external terminal, and a test may be conducted of the electric power supply from the external terminal to each of the internal circuits.

Since, while one of the internal circuits are being tested, the other internal circuits are supplied with electric power from the corresponding power supply circuits, the tests can accurately be carried out even when the internal circuits affect each other in operation.

The above and other objects, features and advantages of the present invention will become apparent from the following description with reference to the accompanying drawings which illustrate examples of the present invention.

DETAILED DESCRIPTION OF THE PREFERRED EMBODIMENTS

Figure 1:
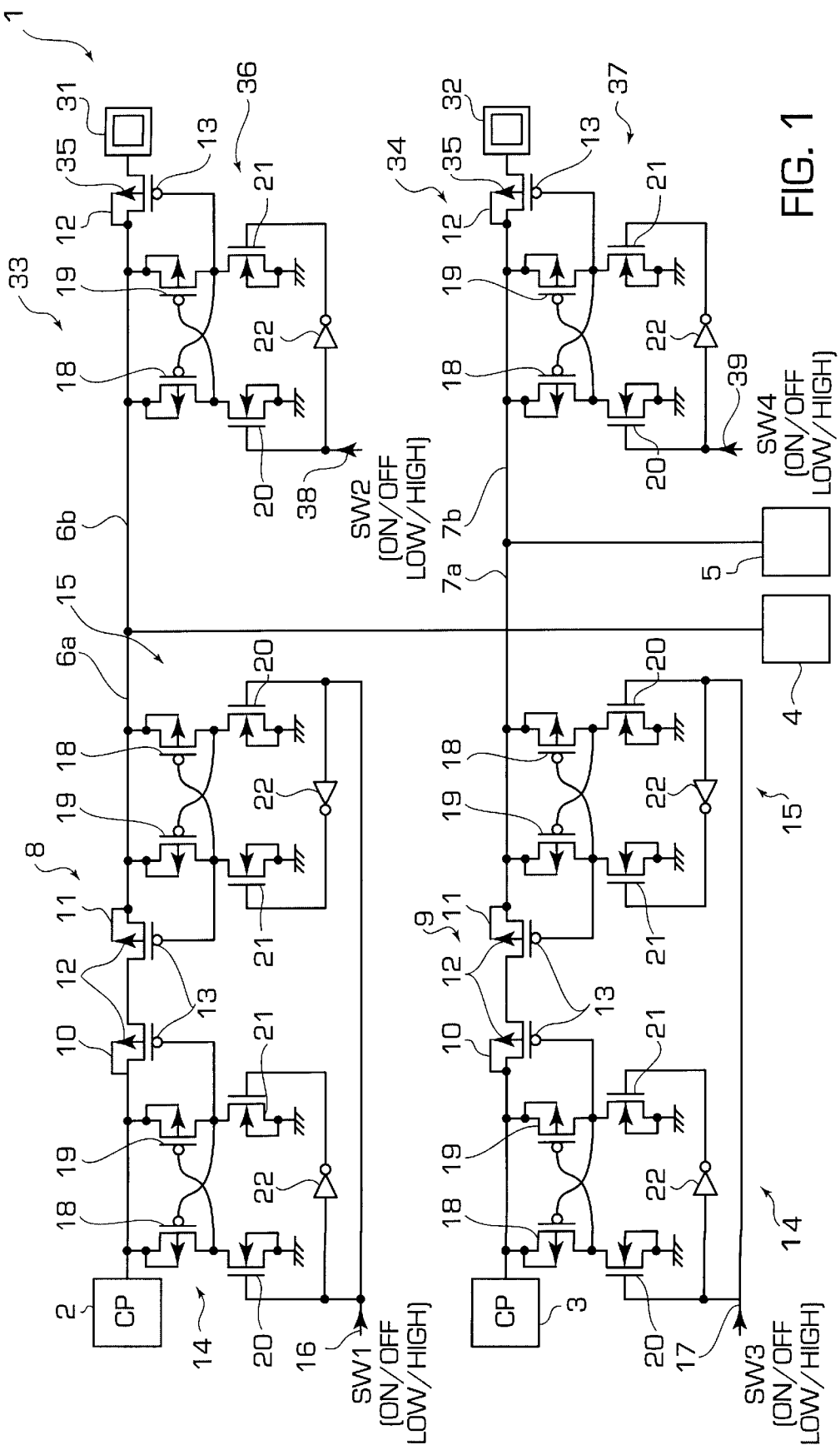
FIG. 1 is a circuit diagram of a conventional semiconductor device.
Figure 2:
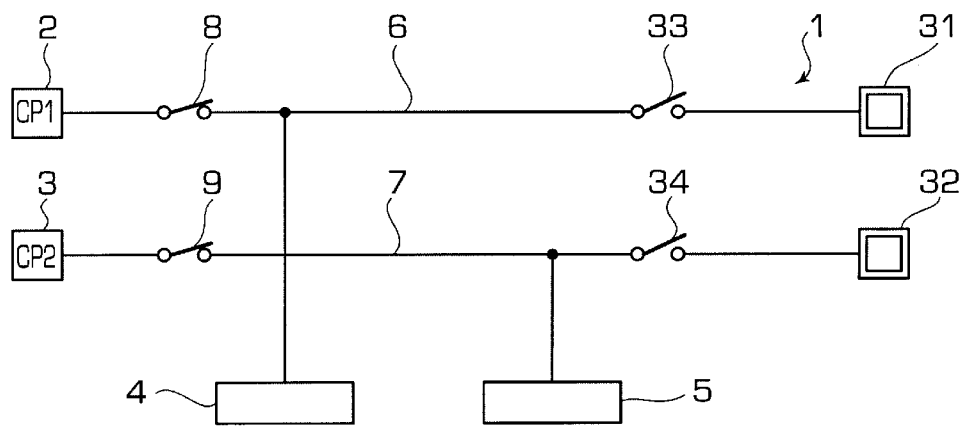
FIG. 2 is a block diagram showing the manner in which switches are turned on and off when the semiconductor device shown in FIG. 1 is in a normal mode of operation.
Figure 3A:
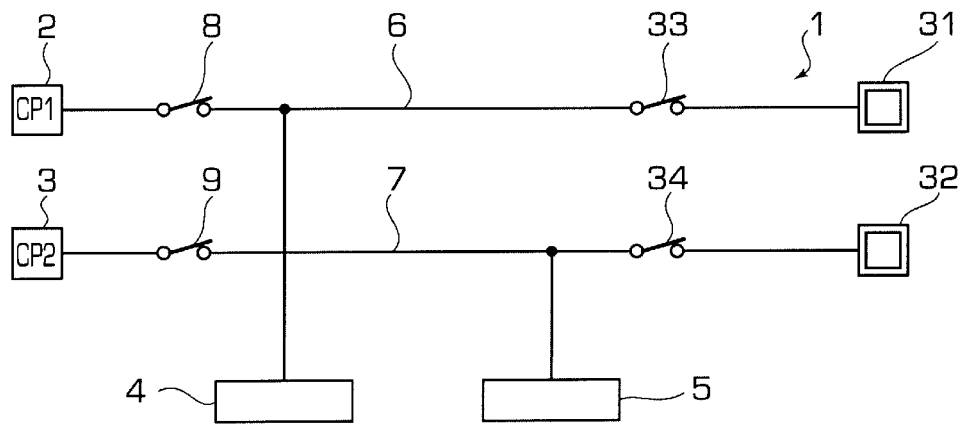
FIGS. 3a and 3b are block diagrams showing the manner in which switches are turned on and off when the semiconductor device shown in FIG. 1 is in test modes of operation.
Figure 3B:
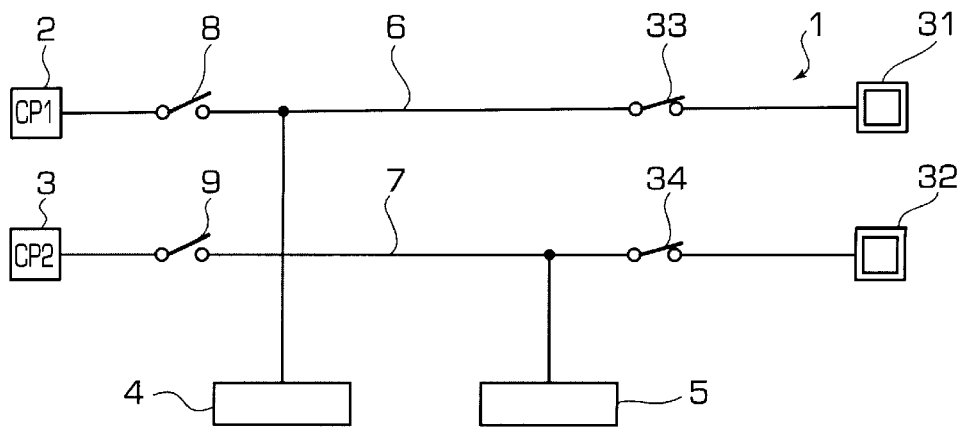
Figure 4:
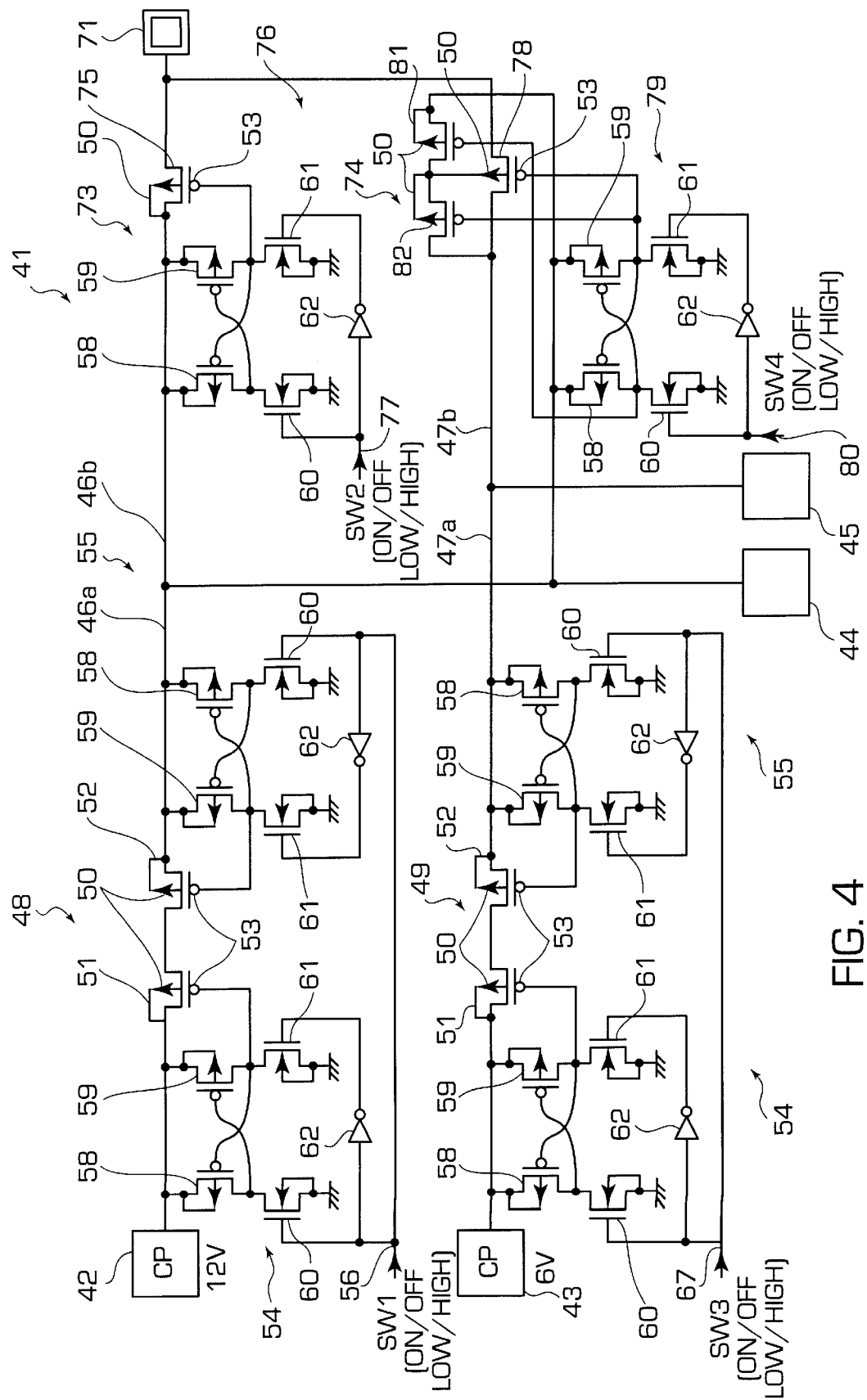
FIG. 4 is a circuit diagram of a semiconductor device according to an embodiment of the present invention.

As shown in FIG. 4, a semiconductor device 41 according to an embodiment of the present invention has a charge pump 42 as a high-voltage power supply circuit for outputting high-voltage positive electric power and a charge pump 43 as a low-voltage power supply circuit for outputting low-voltage positive electric power.

To the charge pumps 42, 43, there are connected high- and low-voltage internal circuits 44, 45, respectively, by high- and low-voltage power lines 46a, 47a, respectively. High- and low-voltage power supply switch units 48, 49 are inserted respectively in the high- and low-voltage power lines 46a, 47a.

The power supply switch units 48, 49 have respective pairs of p-type MOS transistors 51, 52 as power supply switches inserted in series in the respective power lines 46a, 47a. In the MOS transistors 51, 52, back gates 50 are connected in opposite directions.

Level shifters 54, 55 are connected respectively to gate electrodes 53 of the MOS transistors 51, 52 of the power supply switch units 48, 49. The level shifters 54, 55 are connected to control terminals 56, 57 of the power supply switch units 48, 49.

Each of the level shifters 54, 55 comprises a pair of p-type MOS transistors 58, 59 and a pair of n-type MOS transistors 60, 61. The MOS transistors 60, 61 of the level shifters 54, 55 are connected to the control terminals 56, 57 through inverters 62.

The semiconductor device 41 differs from the conventional semiconductor device 1 in that a single connection pad 71 is connected as an external terminal to the two charge pumps 42, 43 and the two internal circuits 44, 45.

To the connection pad 71, there are connected high- and low-voltage control lines 46b, 47b with high- and low-voltage external switch units 73, 74 inserted respectively therein. The low-voltage external switch unit 74 is structurally different from the external switch unit 34 of the conventional semiconductor device 1.

Specifically, the high-voltage external switch unit 73 has a p-type MOS transistor 75 as a high-voltage external switch which has a back gate 50 connected to the control line 46b which in turn is connected to the junction between the charge pump 42 and the internal circuit 44.

The MOS transistor 75 has a gate electrode 53 connected to a level shifter 76 which comprises a pair of p-type MOS transistors 58, 59 and a pair of n-type MOS transistors 60, 61. The MOS transistors 60, 61 are connected to a control terminal 77 through an inverter 62.

The low-voltage external switch unit 74 has a p-type MOS transistor 78 as a low-voltage external switch having a gate electrode 53 which is connected to a level shifter 79. The level shifter 79 comprises a pair of p-type MOS transistors 58, 59 and a pair of n-type MOS transistors 60, 61. The MOS transistors 60, 61 are connected to a control terminal 80 through an inverter 62.

The MOS transistor 78 has a back gate 50 connected to high- and low-voltage control switches 81, 82 each comprising a MOS transistor. The control switches 81, 82 are connected respectively to the high- and low-voltage control lines 46b, 47b.

The MOS transistor as the high-voltage control switch 81 has a back gate 50 connected to the high-voltage control line 46b at a junction intermediate between the switch units 48, 73 for selectively connecting the back gate 50 of the MOS transistor 78 of the low-voltage external switch unit 74 to the high-voltage control line 46b.

The MOS transistor as the low-voltage control switch 82 has a back gate 50 connected to the back gate 50 of the MOS transistor 78 of the low-voltage external switch unit 74 for selectively connecting the back gate 50 of the MOS transistor 78 to the control line 47b connecting the low-voltage power supply switch unit 49 and the low-voltage external switch unit 74.

A control circuit (not shown) is connected to the control terminals 56, 57, 77, 80 of the switch units 48, 49, 73, 74.

The control circuit outputs a control signal "SW1" for turning on and off the power supply switch unit 48 to the control terminal 56, and outputs a control signal "SW2" for turning on and off the external switch unit 73 to the control terminal 77.

Similarly, the control circuit outputs a control signal "SW3" for turning on and off the power supply switch unit 49 to the control terminal 57, and outputs a control signal "SW4" for turning on and off the external switch unit 74 to the control terminal 80.

Figure 5:
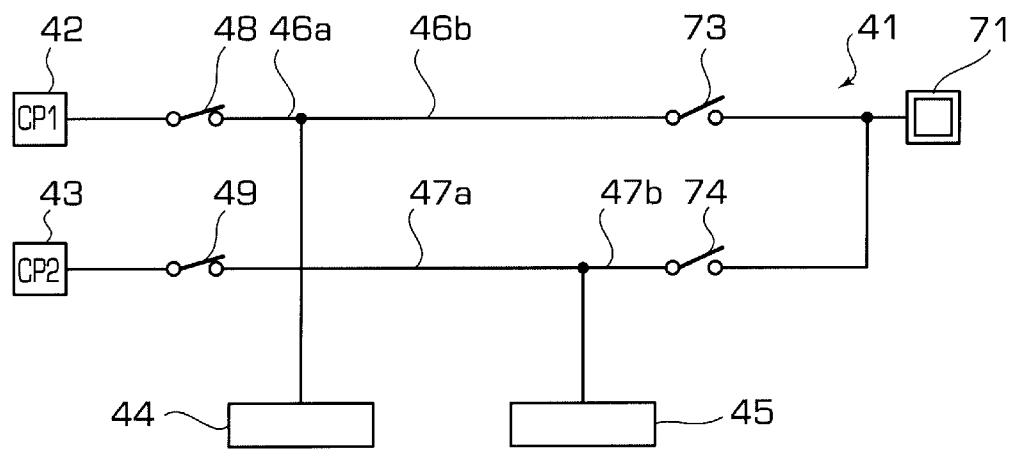
FIG. 5 is a block diagram showing the manner in which switches are turned on and off when the semiconductor device shown in FIG. 4 is in a normal mode of operation.

As shown in FIG. 5, when the semiconductor device 41 is in a normal mode of operation, the power supply switch units 48, 49 are turned on by the control circuit, and the high- and low-voltage external switch units 73, 74 are turned off by the control circuit.

At this time, electric power of different voltages are supplied from the charge pumps 42, 43 through the power supply switch units 48, 49 to the internal circuits 44, 45. Therefore, the internal circuits 44, 45 whose operating voltages are different from each other can operate normally.

For conducting various tests on the semiconductor device 41, the control circuit turns on and off the switch units 48, 49, 73, 74.

Figure 6A:
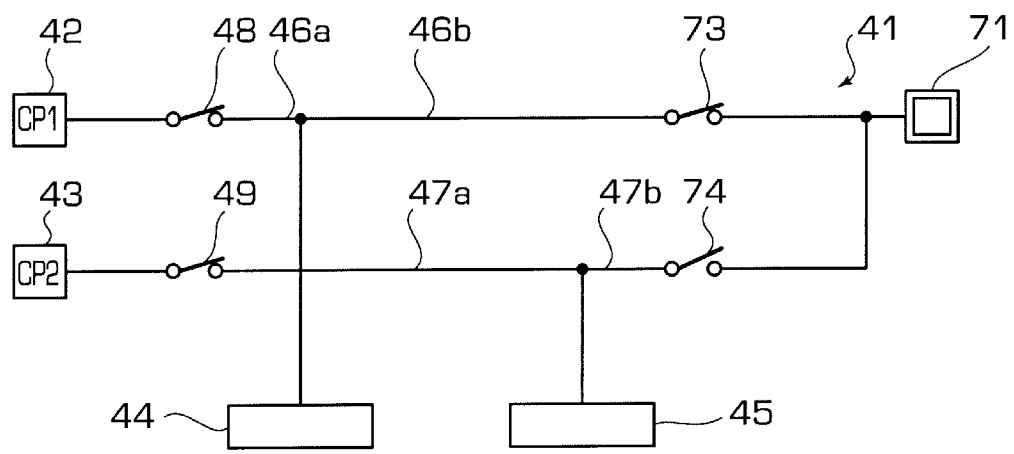
FIGS. 6a and 6b are block diagrams showing the manner in which switches are turned on and off when the semiconductor device shown in FIG. 4 is in a test mode of operation for supplying electric power from power supply circuits of the semiconductor device to internal circuits.

For example, for detecting the high-voltage electric power supplied from the charge pump 42 to the internal circuit 44, the high-voltage power supply switch unit 48, the high-voltage external switch unit 73, and the low-voltage power supply switch unit 49 are turned on, and the low-voltage external switch unit 74 is turned off, as shown in FIG. 6a.

Now, the voltage of the electric power supplied from the high-voltage charge pump 42 to the internal circuit 44 can be detected from the connection pad 71, and the electric power supplied from the low-voltage charge pump 43 to the internal circuit 45 does not affect the connection pad 71.

In a method of testing the semiconductor device 41, for detecting the high-voltage electric power supplied from the high-voltage charge pump 42 to the internal circuit 44, the low-voltage electric power is also supplied from the low-voltage charge pump 43 to the internal circuit 45. Therefore, the test can be conducted accurately even if the internal circuits 44, 45 affect each other.

In the above test, the low voltage from the low-voltage charge pump 43 which is not tested is also applied to the external switch unit 74. However, because the high voltage from the high-voltage charge pump 42 is impressed on the back gate 50 of the MOS transistor 78 through the high-voltage control switch 81, the MOS transistor 78 is capable of reliably disconnecting the low-voltage circuits 43, 45 from the connection pad 71.

At this time, the high voltage from the high-voltage charge pump 42 is applied through the high-voltage control switch 81 to the low-voltage control switch 82. This high voltage is applied to the back gate of the control switch 82. Accordingly, the control switch 82 turns off itself to prevent the high-voltage electric power from being supplied to the low-voltage internal circuit 45.

Figure 6B:
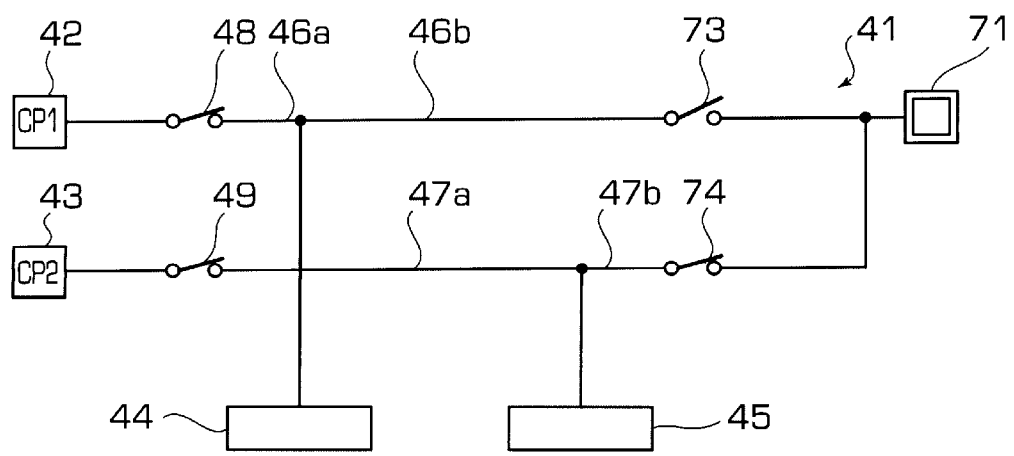

For detecting the low-voltage electric power supplied from the charge pump 43 to the internal circuit 45, the low-voltage power supply switch unit 49, the low-voltage external switch unit 74, and the high-voltage power supply switch unit 48 are turned on, and the high-voltage external switch unit 73 is turned off, as shown in FIG. 6b.

Now, the voltage of the electric power supplied from the low-voltage charge pump 43 to the internal circuit 45 can be detected from the connection pad 71, and the electric power supplied from the high-voltage charge pump 42 to the internal circuit 44 does not affect the connection pad 71.

Since the electric power is supplied to both the internal circuits 44, 45, the test can be conducted accurately even if the internal circuits 44, 45 affect each other.

Figure 7A:
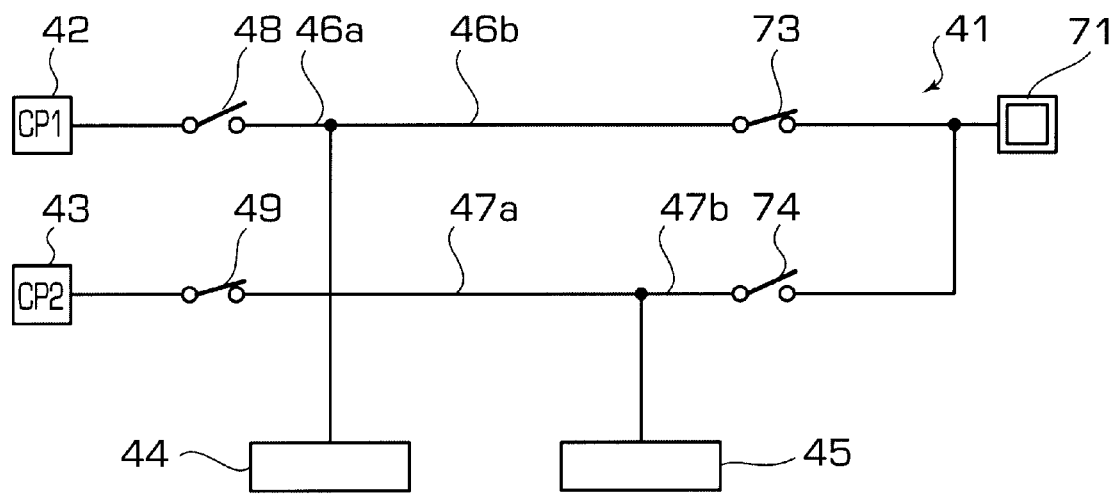
FIGS. 7a and 7b are block diagrams showing the manner in which switches are turned on and off when the semiconductor device shown in FIG. 4 is in a test mode of operation for supplying electric power from an external power source to the internal circuits.

For supplying high-voltage electric power from an external power source connected to the connection pad 71 to the high-voltage internal circuit 44, the high-voltage power supply switch unit 48 and the low-voltage external switch unit 74 are turned off, and the high-voltage external switch unit 73 and the low-voltage power supply switch unit 49 are turned on, as shown in FIG. 7a.

The high-voltage electric power from the external power source can now be supplied through the connection pad 71 to the high-voltage internal circuit 44, and is not supplied through the connection pad 71 to the low-voltage internal circuit 45.

In a method of testing the semiconductor device 41, for supplying the high-voltage electric power from the external power source to the high-voltage internal circuit 44, the low-voltage electric power is also supplied from the low-voltage charge pump 43 to the internal circuit 45. Therefore, the test can be conducted accurately even if the internal circuits 44, 45 affect each other.

In the above test, the low voltage from the low-voltage charge pump 43 which is not tested is also applied to the external switch unit 74. However, because the high voltage from the external power source is impressed on the back gate 50 of the MOS transistor 78 through the high-voltage control switch 81, the MOS transistor 78 is capable of reliably disconnecting the low-voltage circuits 43, 45 from the connection pad 71.

At this time, the high voltage from the high-voltage control switch 81 is applied to the low-voltage control switch 82. Inasmuch as this high voltage is applied to the back gate of the control switch 82, the control switch 82 turns off itself to prevent the high-voltage electric power from being supplied to the low-voltage internal circuit 45.

Figure 7B:
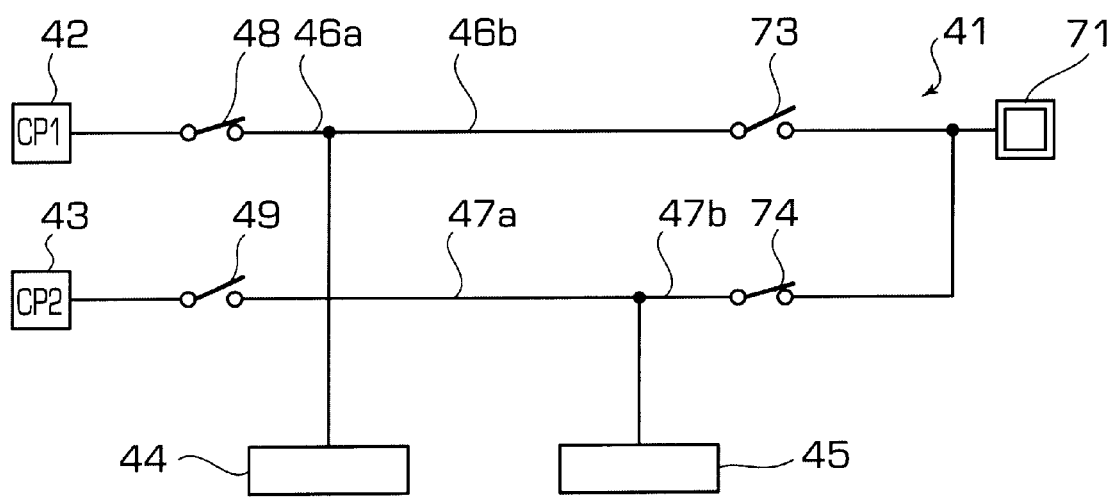

For supplying low-voltage electric power from the external power source connected to the connection pad 71 to the low-voltage internal circuit 45, the low-voltage external switch unit 74 and the high-voltage power supply switch unit 48 are turned on, and the low-voltage power supply switch unit 49 and the high-voltage external switch unit 73 are turned off, as shown in FIG. 7b.

The low-voltage electric power from the external power source can now be supplied through the connection pad 71 to the low-voltage internal circuit 45, and is not supplied through the connection pad 71 to the high-voltage internal circuit 44.

Since the electric power is supplied to both the internal circuits 44, 45, the test can be conducted accurately even if the internal circuits 44, 45 affect each other.

In the semiconductor device 41, the two charge pumps 42, 43 and the two internal circuits 44, 45 are connected to the connection pad 71 by the switch units 48, 49, 73, 74. Consequently, various tests can be performed on the two charge pumps 42, 43 and the two internal circuits 44, 45 through the single connection pad 71.

Even though the semiconductor device 41 employs the plural charge pumps 42, 43 and the plural internal circuits 44, 45, the semiconductor device 41 has only one testing connection pad 71 provided as a terminal projecting outwardly from the semiconductor device 41. Thus, the semiconductor device 41 has a relatively small outer profile and needs a relatively small installation area.

In the testing methods, the two internal circuits 44, 45 are inspected one by one through the single connection pad 71. Because the electric power is supplied from the charge pumps 42, 43 to the internal circuits 44, 45 during the test, the test can be conducted accurately even if the two internal circuits 44, 45 affected each other in operation.

Figure 8:
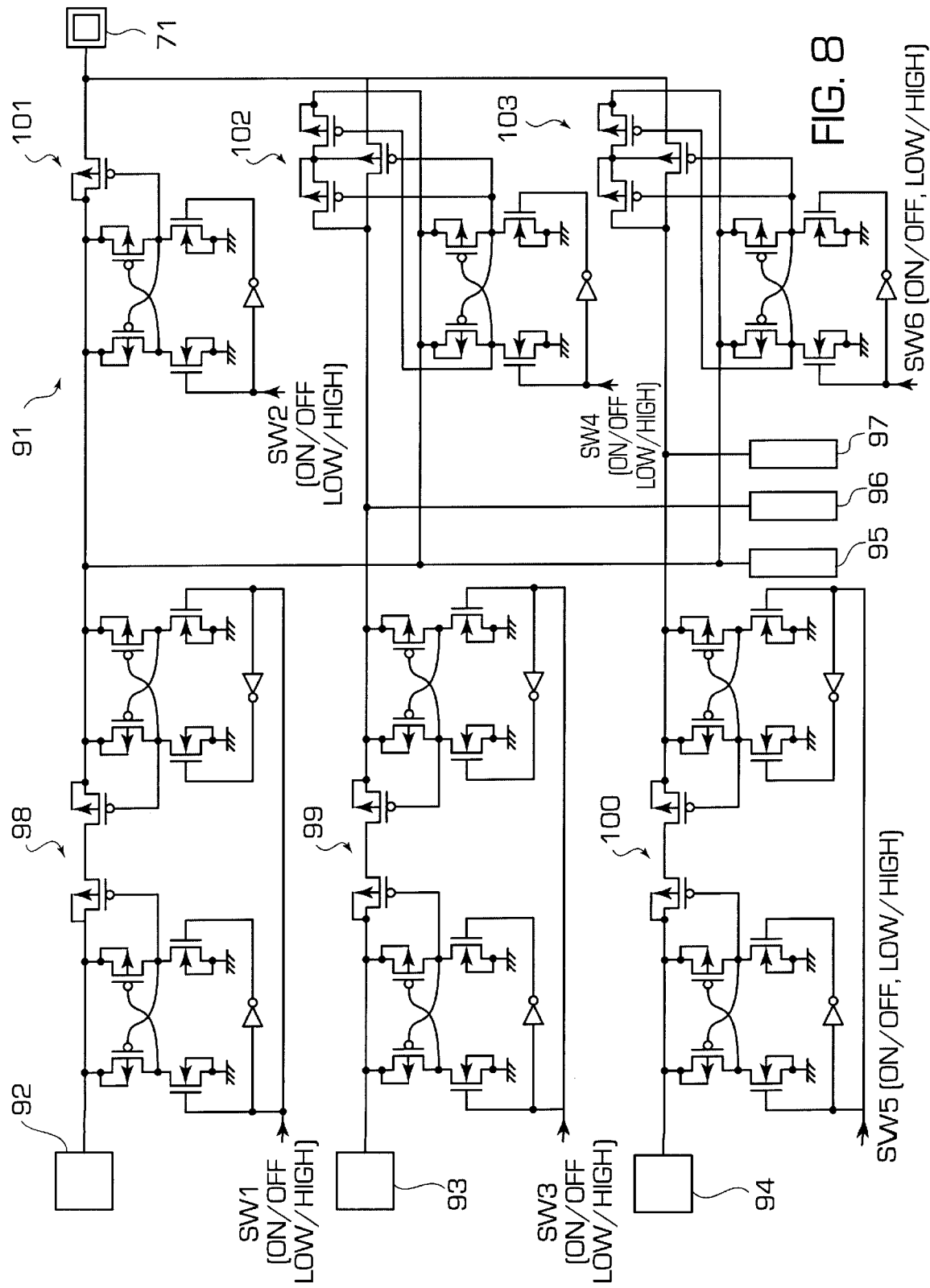
FIG. 8 is a circuit diagram of a semiconductor device according to a first modification of the present invention.

In the illustrated embodiment, the semiconductor device 41 has the two charge pumps 42, 43 and the two internal circuits 44, 45. however, as shown in FIG. 8, a modified semiconductor device 91 may have three charge pumps 92–94 as power supply circuits and three internal circuits 95–97.

With external switch units 102, 103 connected to lines connected to the charge pump 92 which applies a highest voltage, the circuits 92–97 can be tested individually.

In the embodiment shown in FIG. 4, the charge pumps 42, 43 output positive voltages. Therefore, the switching elements for directly switching the power lines 46a, 47a and the control lines 46b, 47b comprise p-type MOS transistors 51, 52, 75, 78.

Figure 9:
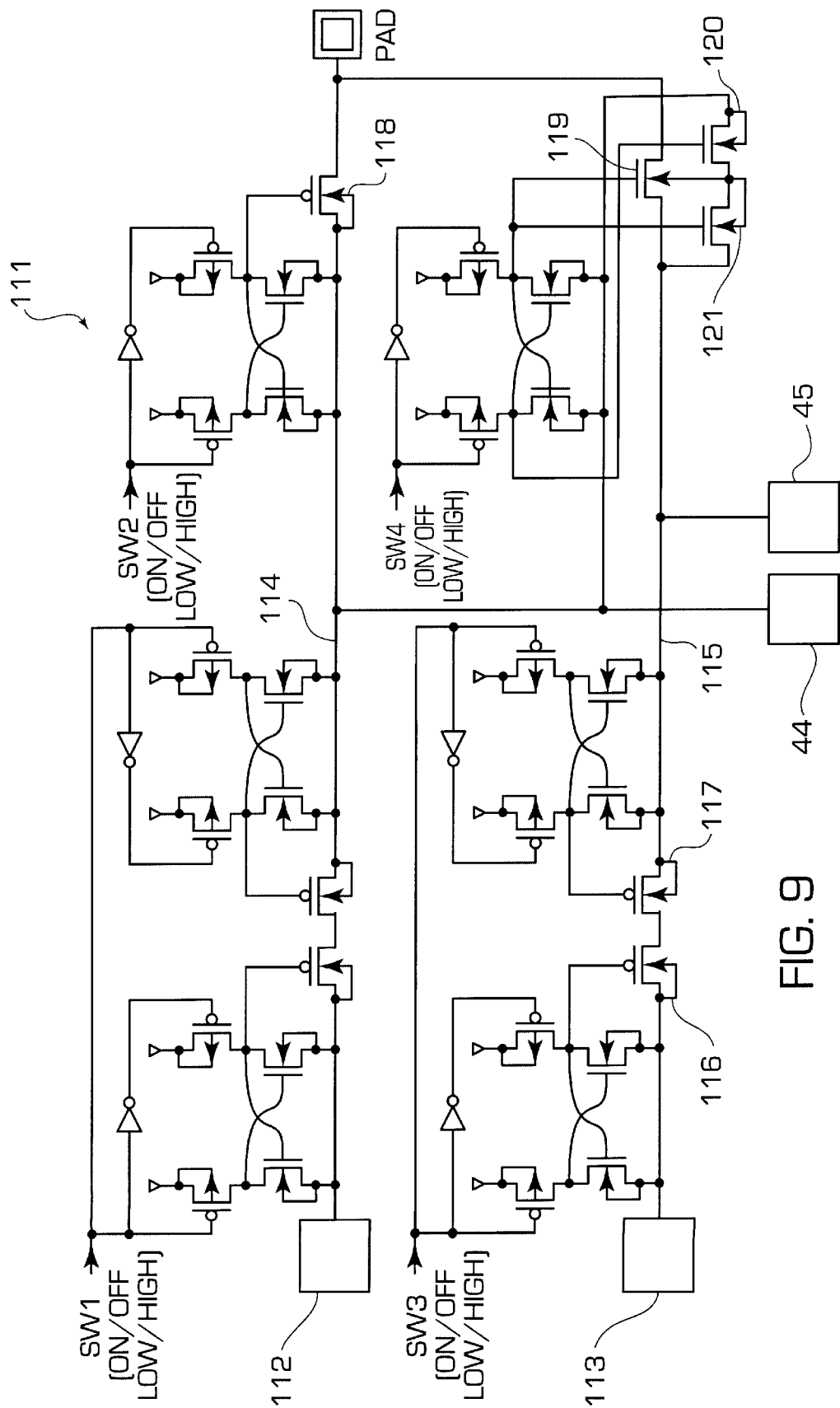
FIG. 9 is a circuit diagram of a semiconductor device according to a second modification of the present invention.

In a modified semiconductor device 111 shown in FIG. 9, charge pumps 112, 113 output negative voltages, and switching elements and control switches for directly switching lines 114, 115 comprise n-type MOS transistors 116–121.

In the semiconductor device 111, the relationship between on and off states and high and low signals of the switch units are in inverse relation to the corresponding relationship in the semiconductor device 41 shown in FIG. 4. If the same relationship is desirable, then inverters may be inserted in signal paths.

While preferred embodiments of the present invention have been described using specific terms, such description is for illustrative purposes only, and it is to be understood that changes and variations may be made without departing from the spirit or scope of the following claims.

What is claimed is:

1. A semiconductor device comprising:
    a plurality of power supply circuits for outputting electric power having voltages different from each other;
    a plurality of power lines connected respectively to said power supply circuits for transmitting the electric power having voltages different from each other;
    a plurality of internal circuits connected respectively to said power lines for operation with the electric power having voltages different from each other;

a plurality of power supply switches inserted respectively in said power lines for turning on and off the electric power transmitted in said power lines;

a plurality of control lines connected respectively to said plurality of power lines between said power supply switches and said internal circuits;

a single external terminal connected to said control lines; and a plurality of external switches inserted respectively in said control lines.

2. A semiconductor device according to claim 1, wherein at least one of said external switches comprises a low-voltage external switch inserted in at least one of said control lines connected to at least one of said power lines for transmitting electric power having a voltage which is not the highest of said voltages, said low-voltage external switch comprising a first MOS transistor having a first back gate, said semiconductor device further comprising:

at least one high-voltage control switch for selectively connecting the first back gate of said first MOS transistor to the control line connecting the power supply switch for turning on and off the electric power having the highest voltage and the internal circuit for operation with the electric power having the highest voltage; and at least one low-voltage control switch for selectively connecting the first gate of said first MOS transistor to the control line connecting the power supply switch for turning on and off the electric power having a lower voltage and the internal circuit for operation with the electric power having a lower voltage.

3. A semiconductor device according to claim 2, wherein said high-voltage control switch comprises a second MOS transistor having a second back gate connected to said control line connecting the power supply switch for turning on and off the electric power having the highest voltage and the internal circuit for operation with the electric power having the highest voltage, said low-voltage control switch comprises a third MOS transistor having a third back gate connected to said first back gate of said first MOS transistor of said low-voltage external switch.

4. A semiconductor device comprising, a high-voltage power supply circuit for outputting electric power having a high voltage;

at least one low-voltage power supply circuit for outputting electric power having a low voltage lower than said high voltage outputted by said high-voltage power supply circuit;

a high-voltage power line connected to said high-voltage power supply circuit for transmitting the electric power having the high voltage outputted from said high-voltage power supply circuit;

at least one low-voltage power line connected to said low-voltage power supply circuit for transmitting the electric power having the low voltage outputted from said low-voltage power supply circuit;

a high-voltage internal circuit connected to said high-voltage power line for operation with the electric power having the high voltage;

at least one low-voltage internal circuit connected to said low-voltage power line for operation with the electric power having the low voltage;

a high-voltage power supply switch comprising a pair of MOS transistors inserted in series in said high-voltage power line and having respective back gates connected in opposite directions;

at least one low-voltage power supply switch comprising a pair of MOS transistors inserted in series in said low-voltage power line and having respective back gates connected in opposite directions;

a plurality of control lines connected respectively to said high-voltage and said at least one low-voltage power supply lines between said high-voltage power supply switch and said high-voltage internal circuit, and between said at least one low-voltage power supply switch and said at least one low-voltage internal circuit, a single external terminal connected to said control lines;

a high-voltage external switch comprising a first MOS transistor inserted in one of said control lines connected to said high-voltage power line., and having a back gate connected to said high-voltage internal circuit;

at least one low-voltage external switch comprising a second MOS transistor inserted in another one of said control lines connected to said low-voltage power lines, and having a back gate connected to said low-voltage internal circuit;

at least one high-voltage control switch having a back gate connected to one of said control lines connecting said high-voltage power supply switch and said high-voltage internal circuit, for selectively connecting the back gate of said second MOS transistor to said one of the control lines; and at least one low-voltage control switch having a back gate connected to the back gate of said second MOS transistor, for selectively connecting said another one of said control lines connecting said low-voltage power supply switch and said low-voltage internal circuit to said back gate of said second MOS transistor.

5. A semiconductor device according to claim 2, wherein each of said power supply circuits comprises means for generating electric, power having a positive voltage, and said first MOS transistor comprises a p-type MOS transistor.

6. A semiconductor device according to claim 3, wherein each of said power supply circuits comprises means for generating electric power having a positive voltage, and each of said second and third MOS transistors comprises a p-type MOS transistor.

7. A semiconductor device according to claim 4, wherein each of said power supply circuits comprises means for generating electric power having a positive voltage, and each of said first and second MOS transistors comprises a p-type MOS transistor.

8. A semiconductor device according to claim 2, wherein each of said power supply circuits comprises means for generating electric power having a negative voltage, and said first MOS transistor comprises an n-type MOS transistor.

9. A semiconductor device according to claim 3, wherein each of said power supply circuits comprises means for generating electric power having a negative voltage, and each of said second and third MOS transistors comprises an n-type MOS transistor.

10. A semiconductor device according to claim 4, wherein each of said power supply circuits comprises means for generating electric power having a negative voltage, and each of said first and second MOS transistors comprises an n-type MOS transistor.

11. A method of testing a semiconductor device having a plurality of power supply circuits for outputting electric power having voltages different from each other, a plurality of power lines connected respectively to said power supply circuits for transmitting the electric power having voltages different from each other, a plurality of internal circuits connected respectively to said power lines for operation, with the electric power having voltages different from each other, a plurality of power supply switches inserted respectively in said power lines for turning on and off the electric power transmitted in said power lines, a plurality of control lines connected respectively to said plurality of power lines between said power supply switches and said internal circuits, a single external terminal connected to said control lines, and a plurality of external switches inserted respectively in said control lines, said method comprising the steps of:

detecting the electric power supplied to one of said internal circuits from one of said power supply circuits by turning on the power supply switch and the external switch connecting said power supply circuit and said external terminal and turning off all the other external circuits connecting the other of said power supply switches and said external terminal; and supplying the electric power to one of said internal circuits from an external power source by turning on the external switch connecting said one of the internal circuits and said external terminal and turning off said power supply switch connecting said internal circuit and said one of the power supply circuits and all the other of said external switches- connecting the other of said internal circuits and said external terminal.

12. A method of testing a semiconductor device having:

a high-voltage power supply circuit for outputting electric power having a high voltage;

at least one low-voltage power supply circuit for outputting electric power having a low voltage lower than said high-voltage outputted by said high-voltage power supply circuit; a high-voltage power line connected to said high-voltage power supply circuit for transmitting the electric power having the high voltage outputted from said high-voltage power supply circuit;

at least one low-voltage power line connected to said low-voltage power supply circuit for transmitting the electric power having the low-voltage outputted from said low-voltage power supply circuit;

a high-voltage internal circuit connected to said high-voltage power line for operation with the electric power having the high voltage;

at least one low-voltage internal circuit connected to said low-voltage power line for operation with the electric power having the flow voltage;

a high-voltage power supply switch comprising a pair of MOS transistors inserted in series in said high-voltage power line and having respective back gates connected in opposite directions;

at least one low-voltage power supply switch comprising a pair of MOS transistors inserted in series in said low-voltage power line and having respective back gates connected in opposite directions;

a plurality of control lines connected respectively to said high-voltage and said at least one low-voltage power supply lines between said high-voltage power supply switch and said high-voltage internal circuit and between said at least one low-voltage power supply switch and said at least one low-voltage internal circuit;

a single external control lines;

a high-voltage external switch comprising a first MOS transistor inserted in the one of said control lines connected to said high-voltage power line, and having a back gate connected to said high-voltage internal circuit;

at least one low-voltage external switch comprising a second MOS transistor inserted in another one of said control lines connected to said low-voltage power line, and having a back gate connected to said low-voltage internal circuit;

at least one high-voltage control switch haying a back gate connected to one of said control lines connecting said high-voltage power supply switch and said high-voltage internal circuit, for selectively connecting the back gate of said second MOS transistor to said one of the control line;

and at least one low-voltage control switch having a back gate connected to the back gate of said second MOS transistor of said low-voltage external switch, for selectively connecting said another of said control lines connecting said low-voltage power supply switch and said low-voltage internal circuit to said back gate of said second MOS transistor, said method comprising the steps of:

supplying electric power from said high-voltage power supply circuit to a high-voltage external switch by turning on both said high-voltage power supply switch and said high-voltage external switch and turning off the respective of said low-voltage external switches;

detecting the electric power supplied from one of said low-voltage power supply circuits to the low-voltage internal circuit by turning on said low-voltage power supply switch and said low-voltage external switch connected to said low-voltage power supply circuit and said 60 high-voltage power supply switch and turning off all the other of said low-voltage power supply circuit and said high-voltage external switches;

applying a first voltage from an external power source to said high-voltage internal circuit by turning on said high-voltage external switch and turning off said high-voltage power supply switch and all of said external low-voltage switches; and applying a second voltage from said external power source to said low-voltage internal circuit by turning on said low-voltage external switch connecting said low-voltage internal circuit and said external terminal and said high-voltage power supply switch and turning off said low-voltage power supply switch connecting said low-voltage internal circuit and said low-voltage power supply circuit, and all the other of said low-voltage power supply circuits.

\* \* \* \* \*